United States Patent
Kawanishi et al.

[11] Patent Number: 6,113,688
[45] Date of Patent: Sep. 5, 2000

[54] PROCESS FOR PRODUCING SINGLE CRYSTALS

[75] Inventors: Souroku Kawanishi, Saga; Makoto Itou, Amagasaki, both of Japan

[73] Assignee: Sumitomo Metal Industries, Ltd., Osaka, Japan

[21] Appl. No.: 09/164,375

[22] Filed: Oct. 1, 1998

[51] Int. Cl.[7] .................................. C30B 15/20
[52] U.S. Cl. .................. 117/30; 117/32; 117/917
[58] Field of Search .................. 117/13, 30, 32, 117/917

[56] References Cited

U.S. PATENT DOCUMENTS

| | | | |
|---|---|---|---|
| 5,132,091 | 7/1992 | Azad | 117/217 |
| 5,162,092 | 11/1992 | Azad | 117/202 |
| 5,360,599 | 11/1994 | Cueman et al. | 117/217 |
| 5,868,832 | 2/1999 | Begg | 117/32 |

*Primary Examiner*—Felisa Hiteshew
*Attorney, Agent, or Firm*—Oblon, Spivak, McClelland, Maier & Neustadt, P.C.

[57] ABSTRACT

A method of growing a single crystal, comprises pulling a single crystal from molten material in a crucible by the Czochralski method; simultaneously applying an axially symmetric, radial cusp magnetic field to the molten material; and simultaneously heating the crucible from both the bottom and the sides; where a ratio of the heating from the bottom of the crucible, q, to the total heating of the crucible, Q, is q/Q, and during the pulling the ratio q/Q changes. The concentration of oxygen in the pulling direction of the crystal may be accurately controlled, and is uniform.

23 Claims, 6 Drawing Sheets

PROCESS FOR PRODUCING SINGLE CRYSTALS

BACKGROUND OF THE INVENTION

1. Field of the Invention

The present invention relates to a method for producing a single crystal by pulling the single crystal from a molten material in a crucible using the Czochralski (CZ) method, and more specifically to a method for producing a single crystal by applying an axially symmetric, radial cusp magnetic field to the molten material in the crucible using a magnetic field applying means installed outside the furnace and having magnets of the same polarity facing each other on upper and lower portions thereof.

2. Description of the Background

In the process of pulling a single crystal using the CZ method, for producing a single crystal of silicon and the like, the single crystal 3 is pulled while rotating from a molten material 2 contained in a quartz crucible 1 as shown in FIG. 1. In this case, oxygen dissolves in the molten material 2 contained in the crucible 1, from the quartz of the crucible 1, resulting in the incorporation of oxygen into the single crystal 3. Although the oxygen incorporated in the single crystal 3 cannot be said to be a harmful element because it enhances the mechanical strength of the crystal, it may cause various crystal defects and may lower the device properties when semiconductor devices are fabricated, if the quantity of oxygen is too large. In any case, control of the oxygen concentration to a target value in the pulling direction or in the radial direction of the single crystal 3 is a critical technical problem in the pulling of the single crystal 3 by the CZ method.

As one of the techniques for solving this problem, a method to apply a cusp magnetic field to a molten material in a crucible has been proposed in Japanese Patent Publication No. 2-1290. In this method, a magnetic field applying means having magnets of the same polarity 4, 4 facing each other on upper and lower portions thereof is installed outside the furnace as shown in FIG. 1, thereby applying an axially symmetric, radial cusp magnetic field to the molten material 2 in the crucible 1. This method features: the repulsion of upper and lower magnetic fields in the vicinity of the liquid surface of the molten material 2 to apply an axially symmetric magnetic field bent at a substantially right angle; the inhibition of convection of the molten material 2 in the crucible 1 by the component of the magnetic field intersecting the liquid surface of the molten material 2 at a right angle, and the component of the magnetic field intersecting the side wall and bottom of the crucible 1 at a right angle; and control of the relative position of the magnetic field distribution for the crucible 1 by the position of the magnets.

In the crucible 1, the molten material 2 produces convection along the internal surface of the crucible 1 as shown by arrows 5, 5. Although fresh molten material 2 is supplied to the vicinity of the internal surface of the crucible 1 due to this convection, whereby the dissolution of oxygen from the internal surface is accelerated, a magnetic field intersecting the side wall and the bottom of the crucible 1 inhibits convection along the internal surface of the crucible 1, controlling the dissolution of oxygen from the internal surface of the crucible as a result of the controlled convection by varying the intensity of the magnetic field. Also, a magnetic field component intersecting the liquid surface of the molten material 2 at a right angle, inhibits the flow of the molten material 2 in the vicinity of the liquid surface, controlling the evaporation of oxygen from the liquid surface. Since the quantity of oxygen in the single crystal 3 is determined by the balance of the transportation of oxygen by convection, the quantity of quartz dissolved, and the quantity of oxygen evaporated, the quantity of oxygen in the single crystal 3 is properly controlled by controlling these factors.

Various methods for improving the pulling of single crystals utilizing this cusp magnetic field have also been proposed. For example, Japanese Patent Application Laid-Open No. 1-282185 discloses a method for making uniform the oxygen concentration distribution in the radial direction of a single crystal by rotating the crucible in the direction opposite to the rotation of the crystal, at a specific speed determined by the sizes of the crucible and the crystal, the quantity of the molten material in the crucible, and the intensity and the distribution of the applied magnetic field.

Japanese Patent Application Laid-Open No. 5-194077 (Japanese Patent Publication No. 8-18898) discloses an improvement of the above method for increasing the rotation speed of the crucible and decreasing the intensity of the cusp magnetic field with the progress of single crystal pulling, in the process of pulling a single crystal from a molten material to which a cusp magnetic field is applied. According to this method, the uniformity of the oxygen concentration in both single crystal pulling and radial directions can be controlled more accurately than the method for controlling the rotation of the crucible without applying a cusp magnetic field to the molten material disclosed in Japanese Patent Application Laid-Open No. 57-135796 (Japanese Patent Publication No. 3-21515).

The previously proposed methods for pulling single crystals using a cusp magnetic fields feature the control of the intensity of magnetic fields as well as rotation speed of crucibles in order to make oxygen concentration in the single crystals uniform. In practice, the intensity of magnetic fields and rotation speed of crucibles are operational parameters for controlling oxygen concentration, and for example, by varying the rotation speed of the crucible with the progress of single crystal pulling, the oxygen concentration in the direction of single crystal pulling can be made uniform.

However, the inventors of the present invention found that control of the rotation speed of the crucible under an applied magnetic field, especially varying the rotation speed of the crucible with the progress of single crystal pulling, is more sensitive to the oxygen concentration in the crystal than in the case of conditions without a magnetic field, making it difficult to control the oxygen concentration accurately. That is, although the oxygen concentration in the crystal is lowered by applying the magnetic field, varying the rotation speed of the crucible is not as effective as expected for making uniform the oxygen concentration distribution in the direction of single crystal pulling. Furthermore, it was found that varying the rotation speed of the crucible under an applied magnetic field tends to produce a significantly adverse effect, damage of the bottom of the crucible, due to melting or the polycrystallization of the single crystal, compared with the case of conditions without a magnetic field.

In the method disclosed in Japanese Patent Application Laid-Open No. 5-194077 (Japanese Patent Publication No. 8-18898), the rotation speed of the crucible is increased while gradually decreasing the intensity of the magnetic field with the progress of single crystal pulling. By this method, although oxygen concentration in the direction of crystal growth (the direction of single crystal pulling) becomes uniform, the following problems also arise.

The irregularity of oxygen concentration in the direction of single crystal pulling is believed to be caused mainly by a decrease in the dissolution of oxygen into the molten material, decreasing the oxygen concentration in the molten material, due to a decrease in the quantity of the molten material in the crucible with the progress of single crystal pulling which decreases the contact area between the molten material and the crucible. Here, if the rotation speed of the crucible is increased with the progress of single crystal pulling, the tendency of the molten material containing a large amount of oxygen present in the vicinity of the bottom of the crucible, reaching immediately underneath the crystal, increases, gradually increasing the oxygen concentration in the single crystal. As a result, the decrease in oxygen concentration with the progress of single crystal pulling is offset.

This method is effective both without an applied magnetic field, and with an applied magnetic field. Under an applied magnetic field, since the convection of the molten material is inhibited, the accuracy of control of the oxygen concentration is considered to be higher than in the case of no applied magnetic field. However, under actual conditions, the control of the oxygen concentration is difficult, and high controlling accuracy is difficult to achieve.

Also, although the convection mode of the molten material is directly changed by varying the rotation speed of the crucible during pulling of the single crystal, this tends to accelerate the damage caused by melting of the bottom of the crucible under an applied magnetic field. This means not only that the usable life of the crucible is shortened, but also increases the possibility of polycrystallization, because quartz in the crucible is mixed into the molten material in the form of particles or debris without completely dissolving, this debris floating due to the rising flow, and reaching the interface of the crystal.

In this method, the intensity of the magnetic field is 0 at the rear half of the straight portion of the single crystal (after solidification percentage, g=50–80%). The reason is that a decrease in the oxygen concentration by the pulling is inhibited. However, making the magnetic field 0 at the rear half of the straight portion of the single crystal means that the conventional pulling without applying magnetic fields is performed in this area, and causes the promotion of a phenomenon in which the internal surface of the quartz crucible is shaved by the convection of heat, and raised to the growing interface. As a result, polycrystallization, a big problem in the conventional CZ method, is easily caused. This has also been proven by the experiments by the inventors of the present invention, demonstrating that the rate of formation of single crystals is lowered (by about 65%).

As described above, although the method for varying the rotation speed of the crucible during single crystal pulling makes uniform the oxygen concentration distribution in the direction of single crystal pulling, even under an applied magnetic field, its accurate control and the extension of the usable life of the quartz crucibles accompanying an increase in the diameter and weight of single crystals, are more difficult than in the case of conditions without an applied magnetic field, although the convection of the molten material is inhibited.

SUMMARY OF THE INVENTION

Therefore, an object of the present invention is to provide a process for producing a single crystal which makes accurately uniform the distribution of the oxygen concentration in the direction of single crystal pulling under an applied magnetic field, and at the same time inhibits damage to the bottom of the crucible due to melting, and the polycrystallization of the single crystal.

In order to decrease the oxygen concentration in single crystals, it is essential to apply a cusp magnetic field to a molten material. It is also necessary to make uniform the oxygen concentration distribution in the direction of single crystal pulling under conditions in which oxygen concentration in the single crystal is decreased. To achieve this, although varying the rotation speed of the crucible is somewhat effective, it also promotes lowered control accuracy, damage to the bottom of the crucible due to melting, and the polycrystallization of single crystals, as described above. The inventors of the present invention repeated various experiments to find the cause of these problems, examined measurements and obtained the following findings.

Single crystal pulling by the CZ method causes vigorous convection of the molten material. Although the detailed form of the convection is complex and is explained in many ways, it is roughly illustrated in FIG. 1. That is, there is a circulating flow 5 rising along the side wall of the crucible 1 after flowing outside the periphery along the bottom of the crucible, and a rising flow 6 rising in the central portion of the crucible 1. The circulating flow 5 is considered to flow downward outside the rising flow 6 and interferes with the rising flow 6. When a cusp magnetic field is applied to the molten material 2 under these conditions, since the magnetic field intersects the bottom and the side wall of the crucible 1, the circulating flow 5 is inhibited, but the magnetic field has little effect inhibiting the rising flow 6 rising in the central portion of the crucible 1. By inhibiting the circulating flow 5, changes in the vicinity of the interface between the internal surface of the crucible 1 and the molten material 2 is inhibited, and the dissolution of oxygen into the molten material 2 is inhibited. However, since the circulating flow 5 interferes with the rising flow 6 on the other hand, when the circulating flow 5 is weakened, the rising flow 6 is enhanced, dominating the convection. If the rotation speed of the crucible is increased under these conditions, the rising flow 6 becomes more significant.

Such convection affects the supply of oxygen to the single crystal 3. That is, oxygen dissolved from the entire internal surface of the crucible 1 is incorporated into the molten material 2, and is transported by natural convection to the solid-liquid interface. Oxygen dissolved from the side wall of the crucible 1 tends to be released from the free surface of the molten material 2, or retained in the vicinity of the side wall of the crucible 1 due to the centrifugal force of the rotating crucible 1. On the other hand, oxygen dissolved from the bottom of the crucible 1 is directly transported mainly by the rising flow 6 in the central portion of the crucible 1 to the solid-liquid interface.

If a magnetic field is applied, the rotation speed of the crucible is increased under conditions dominated by the rising flow 6, and the rising flow 6 is further enhanced, since the quantity of dissolved oxygen transported to the solid-liquid interface increases rapidly, and the accurate control of oxygen concentration becomes difficult. This also causes the acceleration of local damage to the bottom of the crucible due to melting, shortening the life of the crucible 1, as well as releasing quartz of the crucible 1 in the form of particles or debris into the molten material 2 without dissolving completely and carried by the rising flow 6 to the interface with the single crystal 3 causing polycrystallization. This is considered to be the cause of problems arisen when the rotation speed of the crucible is varied under an applied magnetic field. It was concluded as the means for solving such problems, that the use of a bottom heater is effective instead of varying the rotation speed of the crucible.

As a heater to heat the molten material in the crucible, a side heater installed around the crucible has been used. On the other hand, a bottom heater installed underneath the crucible heats the molten material in the crucible from the bottom. The technique combining both types of heaters has been known in single crystal pulling under conditions without an applied magnetic field by the CZ method (Japanese Patent Application Laid-Open Nos. 2-192486 and 2-229786). Since the bottom heater accelerates the dissolution of oxygen from the bottom of the crucible, the oxygen concentration distribution in the direction of crystal pulling can be made uniform by increasing the output of the bottom heater with the progress of single crystal pulling, while keeping the rotation speed of the crucible constant.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 2:
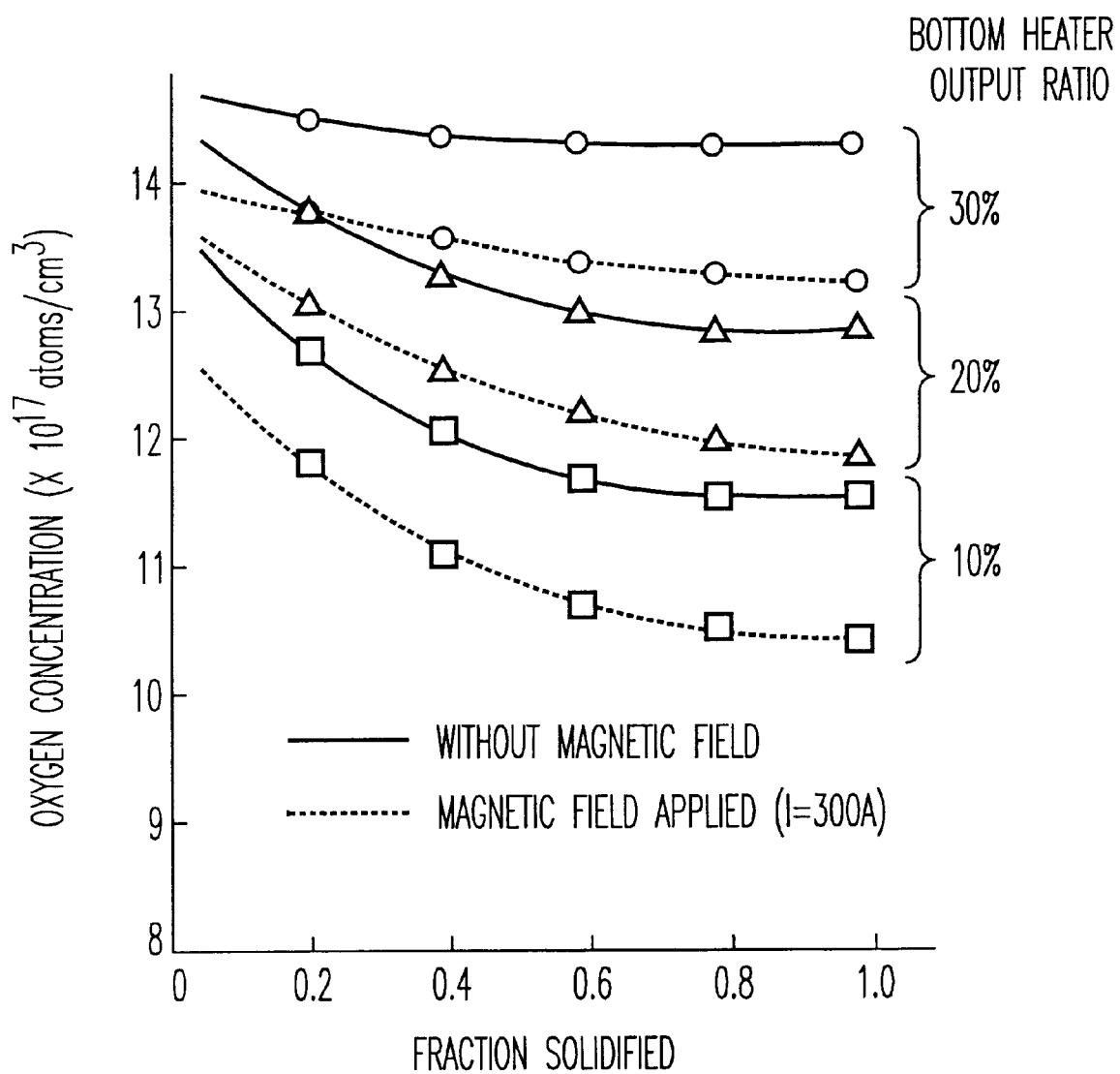
FIG. 2 is a graph showing the relationship between the distribution of oxygen concentration and the output ratio of the bottom heater when the speed of rotation of the crucible is a constant 4 rpm with and without an applied magnetic field.

FIG. 2 shows the relationship between the distribution of the oxygen concentration and the output ratio of the bottom heater when the speed of rotation of the crucible is a constant 4 rpm, when no magnetic field is applied and when a magnetic field is applied. The output ratio of the bottom heater is the ratio of the output of the bottom heater to the total output of the side heater and the bottom heater. In FIG. 2, ○, △, and □ indicate cases where the output ratio is 30%, 20%, and 5%, respectively. The solid lines indicate the oxygen concentrations when no magnetic field is applied, and the broken lines indicate the oxygen concentrations when the intensity of the magnetic field is 300 amperes as a current value.

As seen from FIG. 2, an increase in the output ratio of the bottom heater tends to increase the oxygen concentration. The oxygen concentration tends to decrease when a magnetic field is applied in contrast to when no magnetic field is applied. Furthermore, an increase in the intensity of the magnetic field tends to further decrease the oxygen concentration.

It is known from this that the combined use of the bottom heater is effective for making the oxygen concentration uniform in an applied magnetic field as well as when no magnetic field is applied. What is more important is that since the combined use of the bottom heater does not change the convection structure actively, as with varying the rotation speed of the crucible, and since the diffusing interface of the crucible and the molten material is not irregularly changed by such a change, a decrease in the accuracy of control, the local damage of the bottom of the crucible due to melting, and the polycrystallization of the single crystal, which arouse problems when the rotation speed of the crucible is varied, are effectively prevented under an applied magnetic field where the rising flow is dominant.

Since a decrease in the accuracy of control due to varying of the rotation speed of the crucible, damage to the bottom of the crucible due to melting, and polycrystallization of the single crystal, are not problems when a magnetic field is not applied, where the circulating flow is significant and the rising flow is inhibited by the circulating flow, these problems are not solved by the use of the bottom heater.

The method for producing a single crystal according to the present invention has been developed based on these findings, and a method for producing a single crystal by pulling the single crystal from a molten material in a crucible using the CZ method comprises applying an axially symmetric, radial cusp magnetic field to a molten material in the crucible by using a magnetic field applying means installed outside the furnace and having magnets of the same polarity facing each other on upper and lower portions thereof, heating the molten material in the crucible from the sides and the bottom of the crucible with side and bottom heaters installed around and underneath the crucible; and changing the ratio of the heat q generated by the bottom heater to the total heat Q (q/Q) during the pulling of the single crystal.

Preferably, the speed of rotation of the crucible is made constant, and the heat ratio (q/Q) is increased with the progress of the single crystal pulling. More preferably, the intensity of the cusp magnetic field is reduced with the progress of the single crystal pulling.

In order to change the heat ratio (q/Q), the ratio of the output of the bottom heater to the total outputs of the bottom and side heaters, and/or the height of the bottom heater are controlled.

Figure 3:
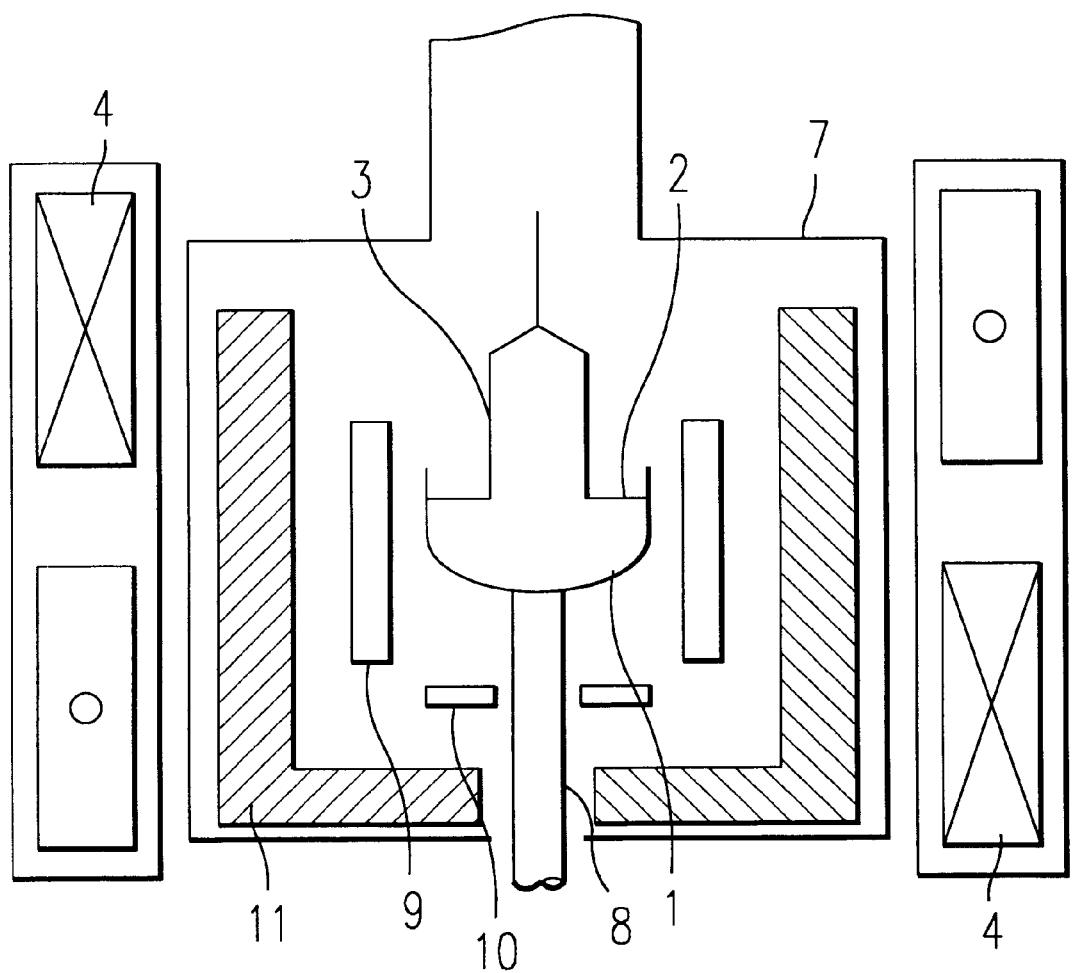
FIG. 3 is a diagram illustrating the structure of equipment suitable for practice of a method for producing a single crystal according to the present invention.

An embodiment of the present invention will be described referring to the drawings. FIG. 3 is a diagram illustrating the structure of equipment suitable for practice of a method for producing a single crystal according to the present invention.

Figure 1:
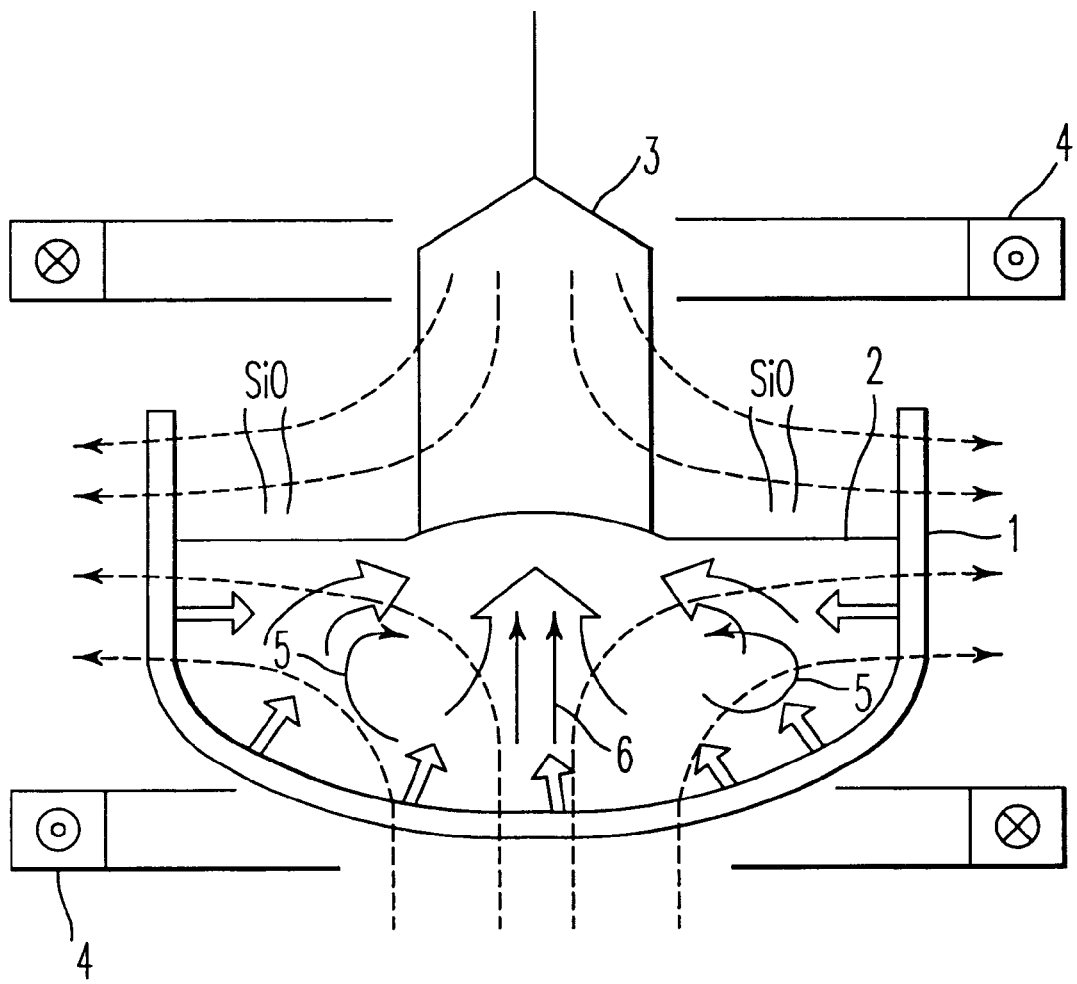
FIG. 1 is a schematic diagram showing CZ pulling using a cusp magnetic field.

This equipment comprises a quartz crucible 1 installed in the central portion of the furnace 7. The crucible 1 is placed on a support spindle 8, and rotates, elevates, and lowers according to the rotation, elevation, and lowering of the support spindle 8. Around the crucible 1 is provided a tubular side heater 9. Underneath the crucible 1 is provided a disc-shaped bottom heater 10 through which the support spindle 8 passes. Around the side heater 9 and underneath the bottom heater 10 is provided an insulator 11 along the internal surface of the furnace 7. Around the furnace 7 is provided a pair of upper and lower magnets 4, 4 as a means for applying a magnetic field. The magnets 4, 4 are tubular coils surrounding the furnace 7, and apply a cusp magnetic field to the molten material 2 in the crucible 1 by adopting the winding structure of the opposite direction (see FIG. 1).

In single crystal pulling, the side heater 9 or both the side heater 9 and the bottom heater 10, are operated to form the molten material 2 in the crucible 1 using any known method.

Under conditions where a cusp magnetic field is applied to the molten material 2, a single crystal 3 is pulled from the molten material 2 while rotating. The crucible 1 is rotated in the direction opposite from the rotation of the single crystal 3 at a constant speed, and the crucible 1 is elevated so that the liquid level of the molten material 2 is kept constant.

In order to make uniform the oxygen concentration in the direction of pulling the single crystal 3, the output ratio of the bottom heater 10 is increased, and the ratio of heat q generated from the bottom heater 10 to total heat Q (q/Q) is increased by gradually lowering the output of the side heater 9, and gradually increasing the output of the bottom heater with the progress of crystal pulling. Instead of increasing the output of the bottom heater 10, or concurrently with increasing the output of the bottom heater 10, the bottom heater 10 may be elevated. If required, the intensity of the cusp magnet 10 field may be lowered. The total heat, that is, the total of heat q generated from the bottom heater 10 and heat q' generated from the side heater 9 (q+q'=Q), tends to increase during crystal pulling.

When the single crystal 3 is pulled, the dissolution of oxygen from the bottom of the crucible 1 is accelerated by increasing the ratio of heat q generated from the bottom heater 10 to total heat Q (q/Q), and the dissolved oxygen is supplied to the interface between the molten material 2 and the single crystal 3 by the rising flow, resulting in the offset of the decrease in the oxygen concentration of the single crystal 3 due to the consumption of the molten material 2. The distribution of the oxygen concentration in the direction of pulling of the single crystal 3 is made uniform in spite of maintaining constant the rotation speed of the crucible 1. By maintaining the rotation speed of the crucible 1 constant, a decrease in the accuracy of the control of the oxygen concentration due to the acceleration of the rising flow, the local damage of the bottom of the crucible 1 due to melting, and the polycrystallization of the single crystal 3, are inhibited. Also, on pulling the rear half of the straight portion of the single crystal 3, the oxygen concentration in the direction of crystal pulling is made uniform by decreasing the intensity of the cusp magnetic field with the progress of crystal pulling. This is based on the idea that an increase in the quantity of oxygen which has not been achieved by only heating with the bottom heater, is supplemented by intentionally lowering the intensity of the magnetic field.

Although described primarily with reference to growing single crystals of silicon, the method of the present invention may be used to grow single crystals of any material which forms an electrically conductive melt. Examples include metals and semiconductors.

Having generally described this invention, a further understanding can be obtained by reference to certain specific examples which are provided herein for purposes of illustration only and are not intended to be limiting unless otherwise specified. The examples of the present invention will be shown below to demonstrate the advantages of the present invention by comparing these examples with comparative examples.

EXAMPLES

Example 1

Figure 4:
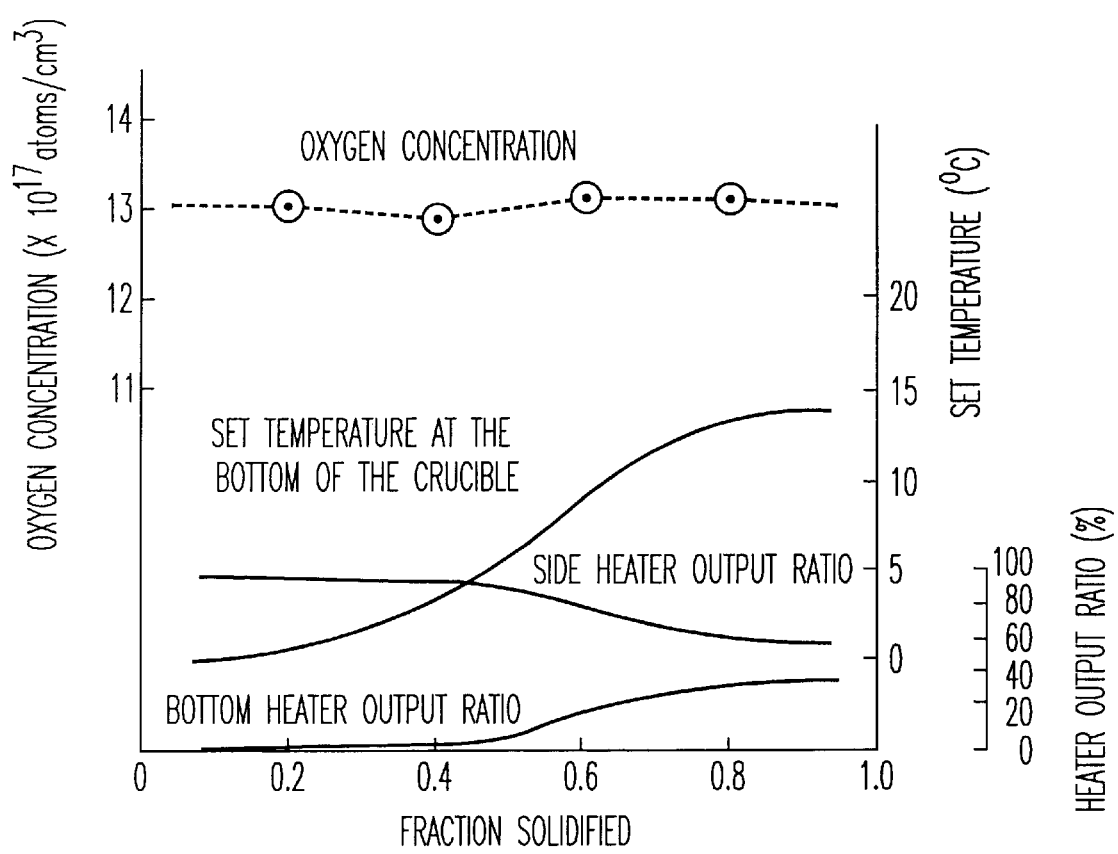
FIG. 4 is a graph showing change in time of the parameters in an embodiment of the present invention.

A single crystal of silicon having a diameter of 200 mm was pulled from 80 kg of molten material melted in a 22-inch crucible. The crystal growing speed (pulling speed) was 0.6–1.0 mm/min, the flow rate of Ar gas supplied into the furnace was 50 liters/min, the pressure in the furnace was 30 torr, the rotation speed of the single crystal was 12 rpm, and the rotation speed of the crucible was 4 rpm in the opposite direction. The target value of the oxygen concentration of the single crystal was $13 \times 10^{17}$ atoms/cm$^3$, the intensity of the cusp magnetic field to achieve the target value was 300 amperes constant as a current value, and the output ratios of the side and the bottom heaters were varied as shown in FIG. 4.

The oxygen concentration of the pulled single crystal in the direction of crystal pulling was within the range between $12.8 \times 10^{17}$ atoms/cm$^3$ and $13.1 \times 10^{17}$ atoms/cm$^3$, and its variance was 2.3 percent. The percentage of single crystal formation in six experiments was 91 percent.

Examples 2, 3, and 4

Figure 5:
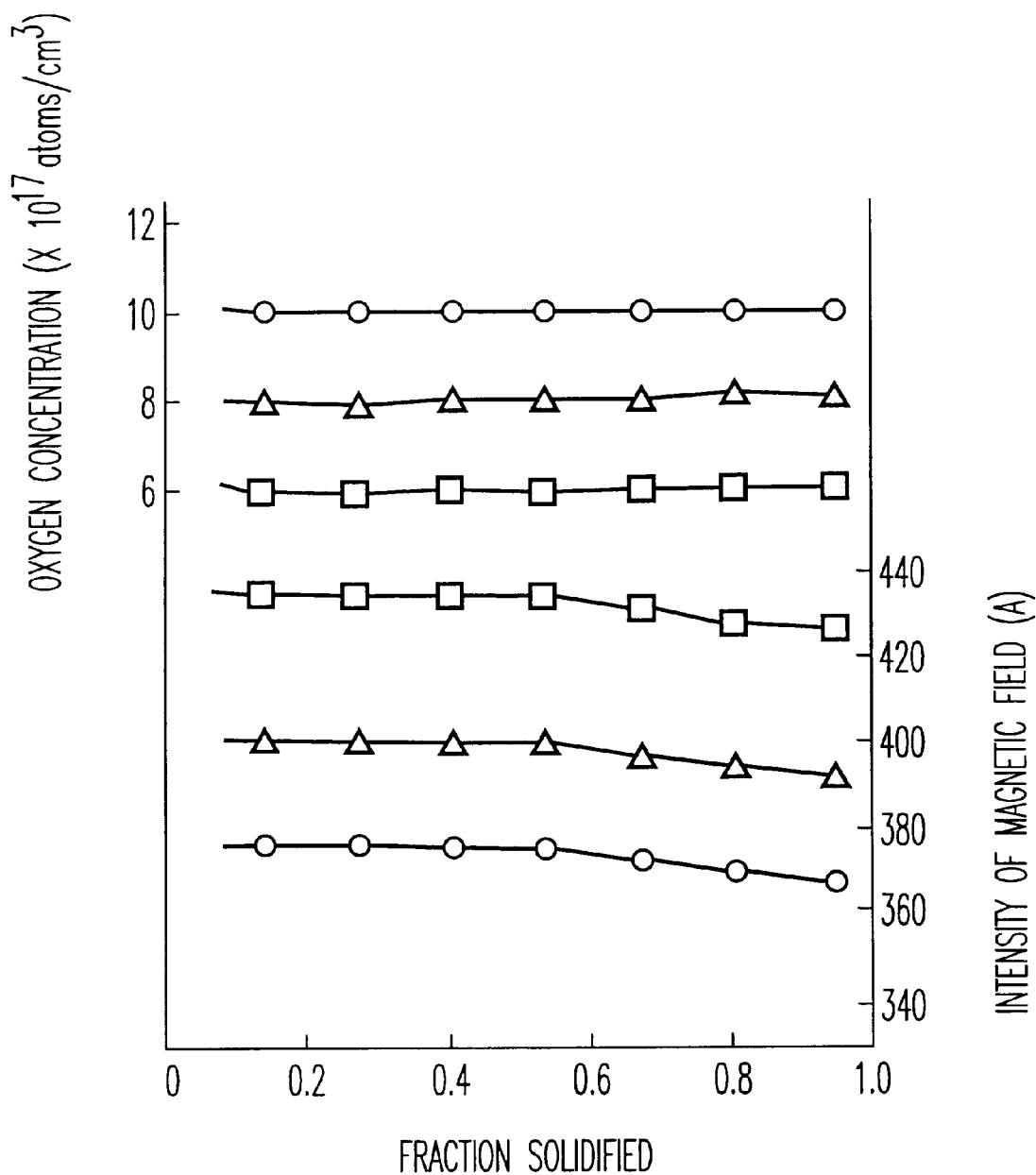
FIG. 5 is a graph showing change in time of the parameters in an embodiment of the present invention.

Example 1 was repeated, except that the target value of the oxygen concentration of the single crystal was changed to $10 \times 10^{17}$, $8 \times 10^{17}$, and $6 \times 10^{17}$ atoms/cm$^3$, the intensities of the cusp magnetic field to achieve these target values was changed to 365, 390, and 430 amperes as current values, and these current values were gradually lowered in the last half of crystal pulling as shown in FIG. 5. The output ratios of the side and the bottom heaters were varied as shown in FIG. 4.

The oxygen concentrations of the pulled single crystals in the direction of crystal pulling were within the ranges between $9.9 \times 10^{17}$ and $10.2 \times 10^{17}$ atoms/cm$^3$, $7.9 \times 10^{17}$ and $8.2 \times 10^{17}$ atoms/cm$^3$, and $5.8 \times 10^{17}$ and $6.0 \times 10^{17}$ atoms/cm$^3$, and their variances were 3.0 percent, 3.8 percent, and 3.4 percent. The percentages of single crystal formation in 18 experiments were 87 percent, 90 percent, and 85 percent.

When the current values were not lowered in the last half of crystal pulling, and was instead made constant, the output ratio of the bottom heater had to be set to a larger value in order to make the oxygen quantity in the direction of crystal pulling uniform, and the percentage of single crystal formation in 10 experiments was 76 percent on average.

Example 5

Figure 6:
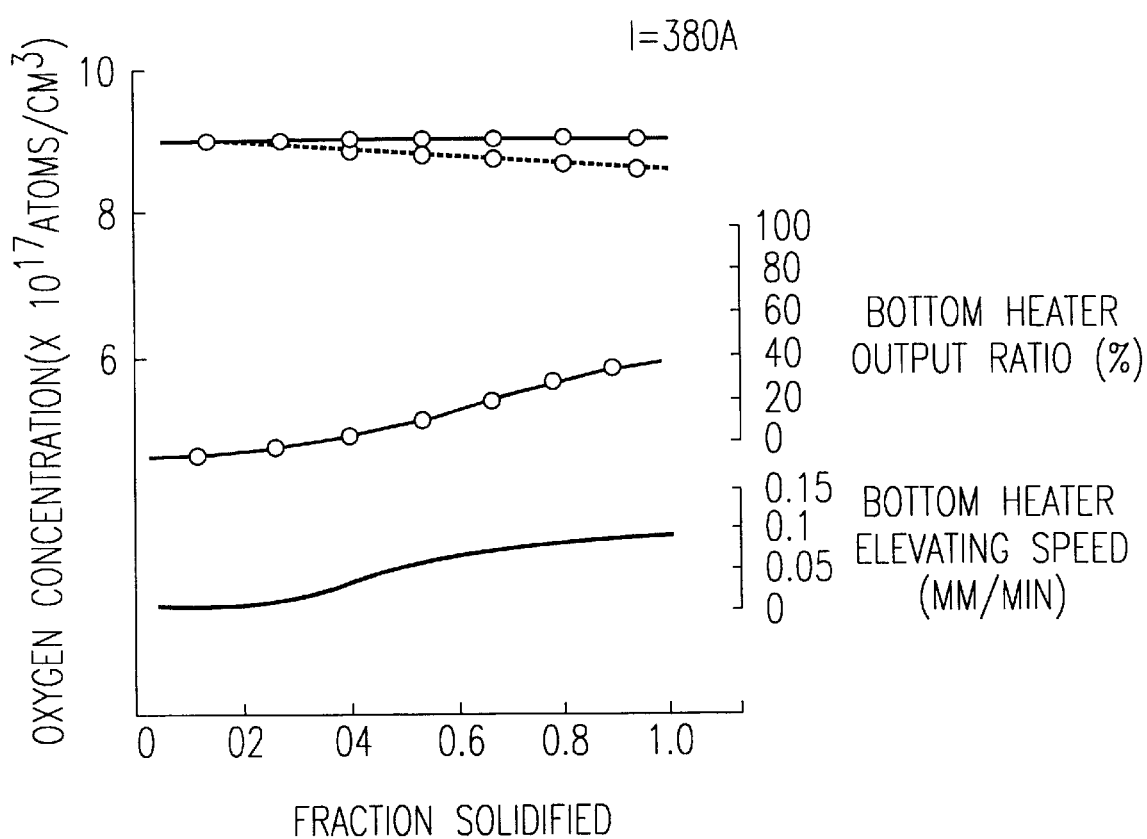
FIG. 6 is a graph showing change in time of the parameters in an embodiment of the present invention.

Example 1 was repeated, except that the target value of the oxygen concentration of the single crystal was changed to $9 \times 10^{17}$ atoms/cm$^3$, the intensity of the cusp magnetic field to achieve the target value was 380 amperes constant as a current value. As FIG. 6 shows, the output ratio of the bottom heater was increased with the progress of crystal pulling, and the bottom heater was elevated following the elevation of the crucible. The oxygen concentration of the pulled single crystal in the direction of crystal pulling was within the range between $8.9 \times 10^{17}$ and $9.1 \times 10^{17}$ atoms/cm$^3$, and its variance was 2.2 percent. The percentage of single crystal formation in seven experiments was 92 percent.

Conventional Example

Example 1 was repeated, except that no bottom heater was used, and the rotation speed of the crucible was raised from 4 rpm to 7 rpm when the solidification percentage became about 70 percent. The target value of the oxygen concentration of the single crystal was $12.5 \times 10^{17}$ atoms/cm$^3$, and the intensity of the cusp magnetic field of 340 amperes was applied from the beginning and was decreased to 0 when the solidification percentage became 65 percent. The oxygen concentration of the pulled single crystal in the direction of crystal pulling was within the range between $12.1 \times 10^{17}$ and $13.0 \times 10^{17}$ atoms/cm$^3$, and its variance was 7.2 percent. The percentage of single crystal formation in eight experiments was 72 percent.

Comparative Example 1

Example 1 was repeated, except that the intensity of the cusp magnetic field was changed to 0. The target value of the oxygen concentration of the single crystal was $13 \times 10^{17}$ atoms/cm$^3$, the rotation speed of the single crystal was 15 rpm, and the rotation speed of the crucible was 8 rpm. The output ratios of the side and the bottom heaters were varied as shown in FIG. 4. The flow rate of Ar gas was 70 liters/min. The oxygen concentration of the pulled single crystal in the direction of crystal pulling was within the range between $12.7 \times 10^{17}$ and $13.3 \times 10^{17}$ atoms/cm$^3$, and its variance was 4.7 percent. The percentage of single crystal formation in five experiments was 70 percent.

Comparative Example 2

Example 1 was repeated, except that the intensity of the cusp magnetic field was changed to 0, and instead of using the bottom heater, the quantity of oxygen was controlled only by the rotation speed of the crucible. That is, in crystal pulling without applying a magnetic field of Comparative Example 1, the quantity of oxygen was controlled by the rotation speed of the crucible instead of the bottom heater. As the rotation speed control, the rotation speed of the crucible was increased from 6 rpm to 8 rpm from the beginning to the end of the straight portion. The target value of the oxygen concentration of the single crystal was $12.5 \times 10^{17}$ atoms/cm$^3$, the oxygen concentration of the pulled single crystal in the direction of crystal pulling was within the range between $12.0 \times 10^{17}$ and $13.1 \times 10^{17}$ atoms/cm$^3$, and its variance was 9.2 percent. The percentage of single crystal formation in seven experiments was 58 percent.

Example 1 adopted bottom heater control under magnetic field applied conditions, and the effects of making the oxygen concentration uniform and preventing transitions were more pronounced than in the Conventional Example adopting rotation speed control under an applied magnetic field. (The variance of oxygen concentration was improved from 7.4 to 2.3 percent, and the percentage of single crystal formation was improved from 72 to 91 percent.) Comparative Example 1 adopted bottom heater control under conditions without applying a magnetic field, and these effects were larger than in Comparative Example 2 adopting rotation speed control under conditions without applying a magnetic field. (The variance of oxygen concentration was improved from 9.2 to 4.2 percent, and the percentage of single crystal formation was improved from 58 to 70 percent.) From the fact that the difference of the effects of the former is larger than the difference of the effects of the latter, it is understood that the effects achieved by changing from rotation speed control to bottom heater control are more significant under an applied magnetic field than without applying a magnetic field.

As seen from the above description, the method for producing a single crystal according to the present invention makes uniform the oxygen concentration distribution of the pulled single crystal in the direction of single crystal pulling without varying the rotation speed of the crucible, by changing the ratio of the heat q generated by the bottom heater to the total heat Q (q/Q) with the progress of crystal pulling when the single crystal is pulled from the molten material to which a cusp magnetic field is applied. Decrease in control accuracy, decrease in the life of the crucible caused by the local damage due to melting, and the polycrystallization of the single crystal, problems which arouse when the rotation speed of the crucible was varied under magnetic field applied conditions, can be effectively prevented. Therefore, high-quality, large-diameter, and heavy single crystals can be produced economically.

Obviously, numerous modifications and variations of the present invention are possible in light of the above teachings. It is therefore to be understood that within the scope of the appended claims, the invention may be practiced otherwise than as specifically described herein.

The priority document of the present application, Japanese Patent Application No. Hei 9-95166, filed Mar. 27, 1997, is incorporated herewith. Also, U.S. Patent application Ser. No. 09/145,417, entitled "Method for Producing Silicon Single Crystal" as well as its priority document, Japanese Patent Application No. Hei 9-282718, filed Sep. 29, 1997, are hereby incorporated by reference.

What is claimed is:

1. A method of growing a single crystal, comprising:
   pulling a single crystal from a molten material in a crucible by the Czochralski method;
   simultaneously applying an axially symmetric, radial cusp magnetic field to said molten material; and
   simultaneously heating said crucible from both the bottom and the sides;
   wherein a ratio of said heating from the bottom of said crucible, q, to the total heating of said crucible, Q, is q/Q, and
   during said pulling said ratio q/Q changes.

2. The method of claim 1, further comprising rotating said crucible at a constant speed during said pulling.

3. The method of claim 2, wherein said ratio q/Q increases during said pulling.

4. The method of claim 3, wherein said magnetic field is reduced in intensity as said pulling progresses.

5. The method of claim 4, wherein said heating from the bottom is by a bottom heater, said heating from said sides is by side heater, and said ratio q/Q is changed by varying an output by said side heaters or said bottom heaters.

6. The method of claim 4, wherein said heating from the bottom is by a bottom heater, said heating from said sides is by side heater, and said ratio q/Q is changed by varying the distance of said bottom heater from the bottom of said crucible.

7. The silicon single crystal prepared by the method of claim 2.

8. The method of claim 4, wherein said melt is a silicon melt.

9. A method of forming a silicon single crystal wafer, comprising:
   forming a silicon single crystal by the method of claim 8, and cutting a wafer from said silicon single crystal.

10. A method of forming a semiconductor device, comprising: forming a silicon single crystal wafer by the method of claim 9; and forming a semiconductor device from said wafer.

11. The silicon single crystal prepared by the method of claim 8.

12. The method of claim 3, wherein said heating from the bottom is by a bottom heater, said heating from said sides is by side heater, and said ratio q/Q is changed by varying an output by said side heaters or said bottom heaters.

13. The method of claim 3, wherein said heating from the bottom is by a bottom heater, said heating from said sides is by side heater, and said ratio q/Q is changed by varying the distance of said bottom heater from the bottom of said crucible.

14. The method of claim 3, wherein said melt is a silicon melt.

15. A method of forming a silicon single crystal wafer, comprising:

forming a silicon single crystal by the method of claim 14; and cutting a wafer from said silicon single crystal.

16. A method of forming a semiconductor device, comprising: forming a silicon single crystal wafer by the method of claim 15; and forming a semiconductor device from said wafer.

17. The silicon single crystal prepared by the method of claim 14.

18. The method of claim 1, wherein said ratio q/Q increases as said pulling progresses.

19. The method of claim 1, wherein said heating from the bottom is by a bottom heater, said heating from said sides is by side heater, and said ratio q/Q is changed by varying an output by said side heaters or said bottom heaters.

20. The method of claim 1, wherein said heating from the bottom is by a bottom heater, said heating from said sides is by side heater, and said ratio q/Q is changed by varying the distance of said bottom heater from the bottom of said crucible.

21. The method of claim 1, wherein said melt is a silicon melt.

22. A method of forming a silicon single crystal wafer, comprising:

forming a silicon single crystal by the method of claim 2 and cutting a wafer from said silicon single crystal.

23. A method of forming a semiconductor device, comprising:

forming a silicon single crystal wafer by the method of claim 22; and forming a semiconductor device from said wafer.

* * * * *

UNITED STATES PATENT AND TRADEMARK OFFICE
CERTIFICATE OF CORRECTION

PATENT NO. : 6,113,688
DATED : September 5, 2000
INVENTOR(S): Souroku KAWANISHI, et al.

It is certified that an error appears in the above-identified patent and that said Letters Patent is hereby corrected as shown below:

On the title page, the 2nd inventor's name is listed incorrectly. Item [75] should read as follows:

--[75]  Inventors:  Souroku Kawanishi, Saga; Makoto Ito, Amagasaki, both of Japan--

Signed and Sealed this

Fifteenth Day of May, 2001

Attest:

NICHOLAS P. GODICI

Attesting Officer    Acting Director of the United States Patent and Trademark Office